United States Patent [19]

Takasaki

[11] Patent Number: 4,929,985

[45] Date of Patent: May 29, 1990

[54] COMPOUND SEMICONDUCTOR DEVICE

[75] Inventor: Kanetake Takasaki, Tokyo, Japan

[73] Assignee: Fujitsu Limited, Kawasaki, Japan

[21] Appl. No.: 346,456

[22] Filed: May 2, 1989

[30] Foreign Application Priority Data

May 18, 1988 [JP] Japan ................... 63-119390

[51] Int. Cl.$^5$ ............................................ H01L 29/48
[52] U.S. Cl. .......................................... 357/15; 357/22
[58] Field of Search ................. 357/15, 67, 71, 22, 357/23.2, 4

[56] References Cited

U.S. PATENT DOCUMENTS 4,732,871 3/1988 Buchmann et al. .................. 437/41

Primary Examiner—Andrew J. James
Assistant Examiner—Mark Prenty
Attorney, Agent, or Firm—Staas & Halsey

[57] ABSTRACT

A compound semiconductor device comprises: a III-V group compound semiconductor substrate and a Schottky junction electrode of p-type amorphous silicon carbide (a-SiC) layer provided on the III-V group compound semiconductor substrate and an amorphous silicon-germanium-boron (a-Si-Ge-B) layer provided on the p-type amorphous silicon carbide layer.

5 Claims, 4 Drawing Sheets

COMPOUND SEMICONDUCTOR DEVICE

BACKGROUND OF THE INVENTION

1. Field of the Invention

The present invention relates to a compound semiconductor device more particularly it relates to a gate electrode of a GaAs Schottky gate field effect transistor (GaAs MESFET).

2. Description of the Related Art

A III-V group compound semiconductor, for example, a GaAs crystal, has a band gap of 1.43 eV at room temperature, which is larger than that of silicon, and has a high resistivity of $10^8 \Omega\cdot cm$ or more. When the GaAs is used as a substrate of a single device and an integrated circuit, the parasitic capacitance is decreased and the elements are easily isolated from each other. Accordingly, GaAs is widely used as a transistor, particularly, a MESFET (Metal Semiconductor Field Effect Transistor), HEMT (High Electron Mobility Transistor) or a Schottky diode.

FIG. 1 shows a cross sectional view of a conventional GaAs MESFET, which comprises a semi-insulating GaAs substrate 1, an n-type GaAs active layer 2 formed on the GaAs substrate 1, a source electrode 3, a drain electrode 4, and a gate electrode 5.

To enhance the barrier height between the gate electrode 5 and the n-type GaAs active layer 2, an amorphous Si-Ge-B is conventionally used as a gate electrode material. The barrier height therebetween is about 1.0 eV. However, the Schottky junction between the amorphous Si-Ge-B layer and the GaAs active layer is unstable, and therefore, a threshold voltage ($V_{th}$) of the FET after annealing is lowered with an elapse of time, as shown in FIG. 5.

The reason why the Schottky junction becomes unstable is that the Ge in the amorphous Si-Ge-B layer is easily reacted with GaAs.

SUMMARY OF THE INVENTION

An object of the present invention is to provide a gate electrode in a III-V group compound semiconductor device wherein the barrier height between the amorphous Si-Ge-B layer and GaAs active layer is maintained, and accordingly, the stability of the Schottky junction therebetween is improved.

According to the present invention, there is provided a compound semiconductor device comprising: a III-V group compound semiconductor substrate and a Schottky junction electrode of a p-type amorphous silicon carbide (a-SiC) layer provided on the III-V group compound semiconductor substrate, and an amorphous silicon-germanium-boron (a-Si-Ge-B) layer provided on the p-type amorphous silicon carbide layer.

DESCRIPTION OF THE PREFERRED EMBODIMENTS

Figure 1:
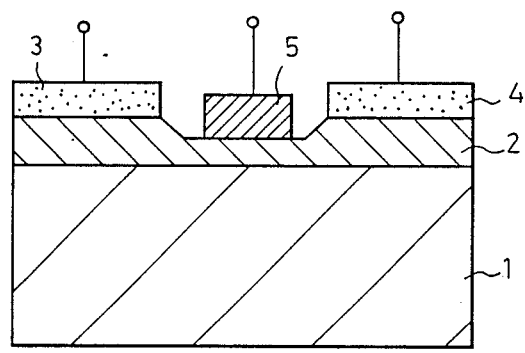
FIG. 1 is a cross-sectional view of a conventional GaAs MESFET.
Figure 2:
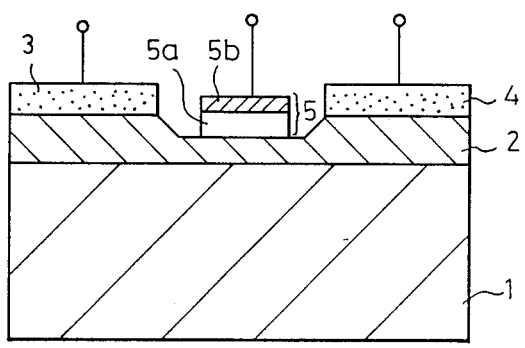
FIG. 2 is a cross-sectional view of an example of a GaAs MESFET according to the present invention.

The preferred embodiments will now be described. FIG. 2 is a cross-sectional view of an example of the present invention.

In FIG. 2, the structure composed of a semi-insulating GaAs substrate 1, an n-type GaAs layer 2, AuGe/Ni source drain electrodes 3 and 4 is the same as the conventional structure. The gate electrode 5 has a two-layer structure and consists of a p-type amorphous silicon carbide (a-SiC) layer 5a having a thickness of, for example 800 Å, and a conventional amorphous Si-Ge-B layer 5b having a thickness of, for example, 3000 Å. The a-SiC layer 5a of the present invention preferably has a thickness of 150 to 1000 Å.

The production process of the compound semiconductor shown in FIG. 2 will now be explained with reference to FIGS. 3A to 3E.

Figure 3A:
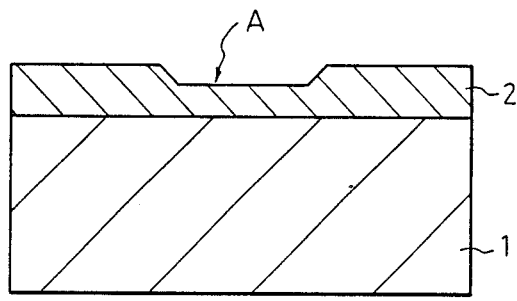
FIGS. 3A to 3E are cross-sectional views of steps in the production of the example shown in FIG. 2.

As shown in FIG. 3A, a GaAs active layer 2 is formed at a surface of a semi-insulating GaAs substrate 1 by implanting n-type ions, e.g., silicon ions therein to a dosage of $10^{14}$ to $10^{15}$ /cm$^3$, whereby an n-type GaAs active layer 2 is formed on the substrate 1.

Then a center portion of the n-type GaAs layer 2 wherein a gate electrode is to be formed is etched so that a recess A is formed thereat.

Figure 3B:
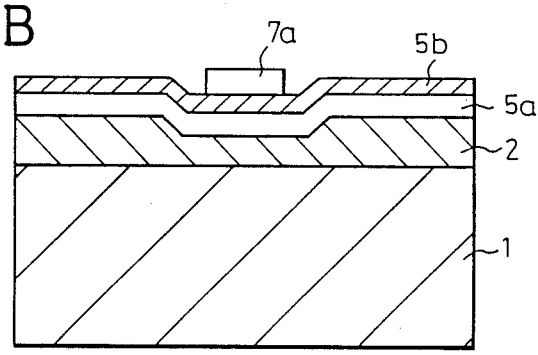

Then, as shown in FIG. 3B, a p-type amorphous silicon carbide (a-SiC) layer 5a having a thickness of 150 to 1000 Å is formed by a plasma CVD process on the entire exposed surface of the n-type GaAs layer 2 having the recess A, at a growth temperature of from 300 to 450° C. using reactive gases, e.g., SiH$_4$, CH$_4$ and B$_2$H$_6$, at a pressure of 0.2 to 2 Torr. The growth temperature of 300° to 450° C. is preferably used to prevent the diffusion of arsenic (As) from the n$^-$-type GaAs layer 2 during the growth of the p-type a-SiC layer. Then an amorphous silicon-germanium-boron (a-Si-Ge-B) layer 5b having a thickness of about 3000 Å is formed on the p-type a-SiC layer 5a by a reduced pressure CVD process using reactive gases e.g., SiH$_4$, GeH$_4$ and B$_2$H$_6$.

As the formation process of the a-SiC layer, an ECR (Electron Cyclotron Resonance) CVD using reactive gases Si$_2$H$_6$, C$_2$H$_6$, C$_3$H$_8$ may be used, except for the plasma CVD process. After the a-SiC layer and the a-Si-Ge-B layer are formed, a patterned resist 7 is formed over the gate forming region.

Figure 3C:
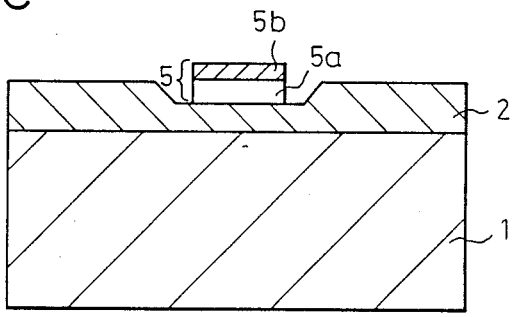

Then, as shown in FIG. 3c, the a-SiC layer 5a and the a-Si-Ge-B layer 5b are dry-etched by using the resist 7 as a mask, and thus a gate electrode 5 composed of the two layers is formed on the n-type GaAs layer 2.

Figure 3D:
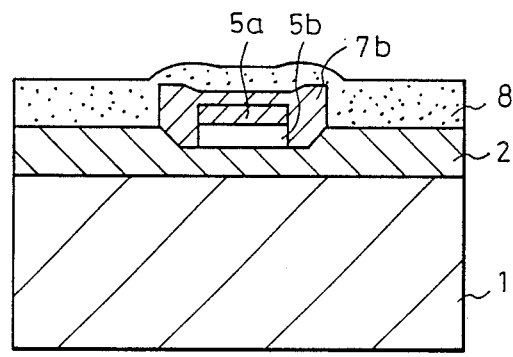
Figure 3E:
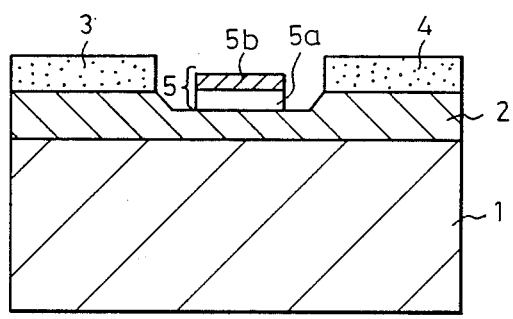
Figure 4:
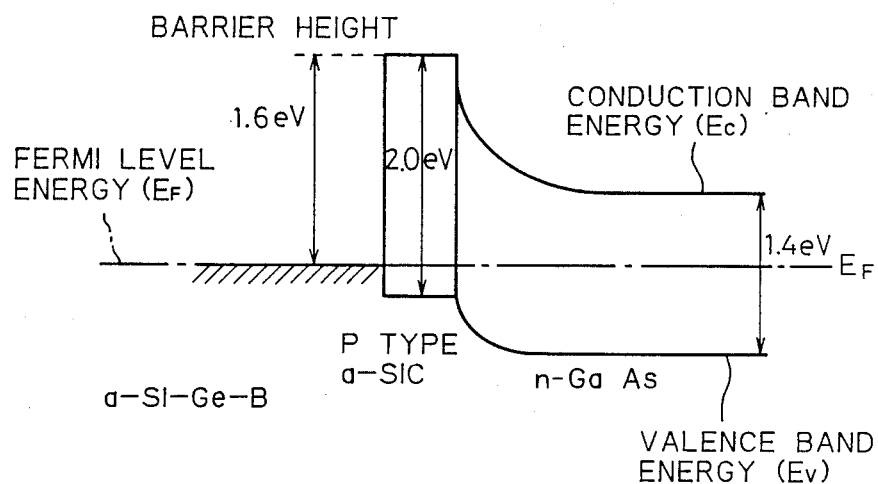
FIG. 4 is a band diagram of a two layer gate electrode obtained by the present invention, and a GaAs substrate.

Then, as shown in FIG. 3D a patterned resist 7b is formed over the gate electrode 5a, 5b at the recess portion, and a AuGe/Ni metal layer 8 is sputtered on the entire exposed surface. Subsequently, the AuGe/Ni layer 8 on the resist 7b is lifted off, and source and drain electrodes 3 and 4 of AuGe/Ni are formed on the n-type GaAs layer 2 as shown in FIG. 3E. These source and drain electrodes 3, 4 make ohmic contact to said n-type GaAs layer 2. Accordingly a GaAs compound Schottky gate transistor having a gate electrode composed of a p-type a-SiC layer 5a, which prevents a reaction with the GaAs layer, and an a-Si-Ge-B layer 5b can be realized. The obtained GaAs compound MESFET of the GaAs substrate and the two layer electrode composed of the p-type a-SiC layer 5a and the a-Si-Ge-B layer 5b, has a band diagram as shown in FIG. 4. The band gap between the conduction band and the valence band of GaAs is 1.4 eV and the band gap of the p-type a-SiC is 2.0 eV. The barrier height of the p-type a-SiC from the Fermi level is 1.6 eV, which shows that the barrier height is enough.

When the gate voltage (VG) is applied, since the electric field in the GaAs surface is reduced owing to the existence of p-type a-SiC, is the threshold voltage $V_{th}$ is increased.

Figure 5:
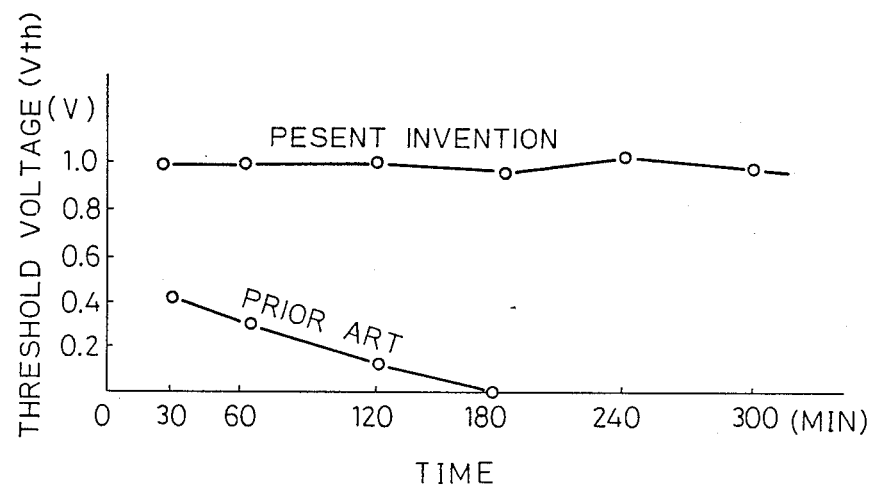
FIG. 5 is a graph illustrating the changes of FET properties, particularly the $V_{th}$, after annealing at a temperature of 300° C.

According to the present invention, as shown in FIG. 5 the FET properties after annealing at a temperature of 300° C., particularly a change of threshold voltage ($V_{th}$), are maintained at a substantially constant level even though a time of e.g., 300 min., has elapsed. One reason for this stability may be the a-SiC is such a hard film that the a-SiC could be a barrier for diffusion of Ge of the Si-Ge-B layer. On the other hand, the threshold voltage of the prior art not having the a-SiC is gradually deteriorated, as explained in the description of the prior art.

Furthermore, according to the present invention, a threshold voltage larger than that of the prior art can be obtained.

The above-mentioned advantageous points can be realized by providing the a-SiC layer between the conventional two layers i.e., GaAs and Si-Ge-B layers, which prevents a diffusion of Ge of the Si-Ge-B layer into GaAs layer, whereby the Schottky junction between the GaAs layer and the gate electrode is stabilized.

The present invention may be used not only in the gate electrode of above-explained MESFET but also in the gate electrode of an HEMT having an active layer of GaAs, an electron supply layer of AlGaAs, and a Schottky diode having a substrate of a III-V group compound semiconductor, e.g., GaAs, $Al_xGA_{1-x}As$, Inp or $In_xGa_{1-x}As$, etc.

I claim:

1. A compound semiconductor device comprising: a III-V group compound semiconductor substrate and a Schottky junction electrode of a p-type amorphous silicon carbide (a-SiC) layer provided on the III-V group compound semiconductor substrate and an amorphous silicon-germanium-boron (a-Si-Ge-B) layer provided on the p-type amorphous silicon carbide layer.

2. A compound semiconductor device according to claim 1, wherein the thickness of the p-type a-SiC layer is 150 to 1000 Å.

3. A compound semiconductor device according to claim 1, wherein the p-type a-SiC layer is formed by a plasma or ECR CVD process at a growth temperature of 300° to 450° C.

4. A compound semiconductor device according to claim 1, wherein said III-V group compound semiconductor is one of GaAs, $Al_xGa_{1-x}As$, Inp and $In_xGa_{1-x}As$.

5. A compound semiconductor device comprising:
a III-V group compound semiconductor substrate;
an active layer of a III-V group compound semiconductor formed on said substrate;
a gate electrode formed on said active layer so as to form a Schottky junction therebetween, said gate electrode including
an amorphous silicon carbide layer formed on the active layer and
an amorphous silicon-germanium-boron layer formed on said amorphous silicon carbide layer; and
source and drain electrodes formed on said active layer on both sides of the gate electrode so as to form ohmic contacts to said active layer.

* * * * *

UNITED STATES PATENT AND TRADEMARK OFFICE
CERTIFICATE OF CORRECTION

PATENT NO. : 4,929,985

DATED : May 29, 1990

INVENTOR(S) : Kanetake TAKASAKI

It is certified that error appears in the above-identified patent and that said Letters Patent is hereby corrected as shown below:

Title page:

[57] ABSTRACT, line 3, before "p-type" insert --a--.

Col. 1, line 8, after "device" insert --;--.

Col. 2, line 51, change "3c" to --3C--.

Col. 3, line 10, delete "is";
       line 30, after "into" insert --the--;
       line 34, after "of" insert --the--.

Signed and Sealed this

Eleventh Day of June, 1991

Attest:

HARRY F. MANBECK, JR.

Attesting Officer    Commissioner of Patents and Trademarks